Oct. 1, 1968 TOSHIO KUROSAWA ET AL 3,404,321

TRANSISTOR BODY ENCLOSING A SUBMERGED INTEGRATED RESISTOR

Filed Jan. 6, 1964

INVENTORS
TOSHIO KUROSAWA
HIROSHI SHIBA
ICHIEMON SASAKI
TAKAYUKI YANAGAWA
Hopgood
ATTORNEY

United States Patent Office 3,404,321

Patented Oct. 1, 1968

3,404,321

TRANSISTOR BODY ENCLOSING A SUBMERGED INTEGRATED RESISTOR

Toshio Kurosawa, Hiroshi Shiba, Ichiemon Sasaki, and Takayuki Yanagawa, Tokyo, Japan, assignors to Nippon Electric Company Limited, Tokyo, Japan, a corporation of Japan Filed Jan. 6, 1964, Ser. No. 335,896

Claims priority, application Japan, Jan. 29, 1963, 38/3,978

1 Claim. (Cl. 317—235)

ABSTRACT OF THE DISCLOSURE

A semiconductor structure is described wherein a resistive element is located deeply within the body of the semiconductive material whereby it is provided with a relatively high resistivity. The resistive element is combined with a transistor to form a unique integrated structure.

This invention relates to semiconductor devices, and more particularly to composite semiconductor devices of extremely small size which are commonly known as solid circuits.

In the manufacture of such composite semiconductor devices, it is customary to first form isolated layers in a semiconductor wafer by diffusion of impurities after which transistors, diodes, resistors and capacitors, or selected ones of these, are then also provided inside the wafer. These circuit elements are then suitably interconnected to produce a desired circuit configuration. In these prior art devices the resistors are usually formed simultaneously with the base layers of the transistors during the impurity diffusion step. Due to the extremely small size of these devices, however, the resistance value which can be obtained in a given size device is severely limited.

Accordingly, it is an object of this invention to make available a composite semiconductor device having a resistor element therein, in which it is possible to provide resistance values substantially larger than can be achieved with conventional devices of similar size.

All of the objects, features and advantages of this invention and the manner of attaining them will become more apparent and the invention itself will be best understood by reference to the following description of an embodiment of the invention taken in conjunction with the accompanying drawing, in which—

Figure 1:
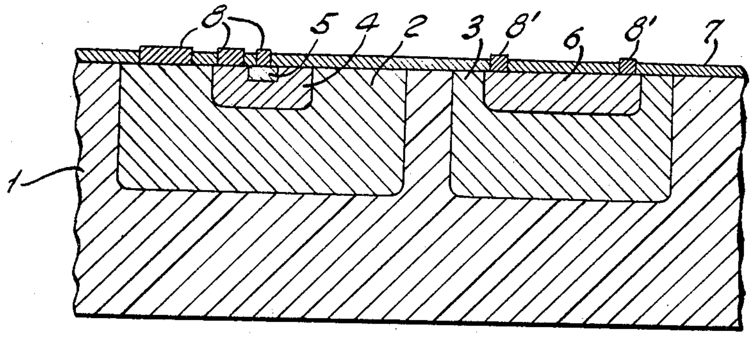
Fig. 1. PRIOR ART
FIG. 1 is a sectional view of a conventional semiconductor device.

Referring now to FIG. 1, there is shown a sectional view of a conventional composite semiconductor device in which the numeral 1 designates a P-type semiconductor wafer. The numerals 2 and 3 indicate N-type layers isolated from one another by a PN junction; numerals 4 and 6 indicate P-type layers, 5 is an N-type layer, 7 an oxide film, and 8 and 8' indicate electrodes at the surface of the semiconductor body. The numerals 2, 4 and 5 indicate respectively a collector, base and emitter, which together form one transistor. The numeral 6 indicates a resistor which is made simultaneously with the base layer 4 by diffusion of impurities. This resistor is in contact with the separate electrodes 8' at both ends, for connection to other circuit elements external to the semiconductor body as desired. The diffused layer 6 which forms the resistor may have a sheet resistivity of, for example, 300 ohms and is formed to have a length-to-width ratio of 10 in order to provide an overall resistance of 3,000 ohms. A larger length-to-width ratio is required for producing greater resistances, and it has been found impracticable to provide a high resistance in a very small composite or solid semiconductor circuit such as that under consideration.

Figure 2:
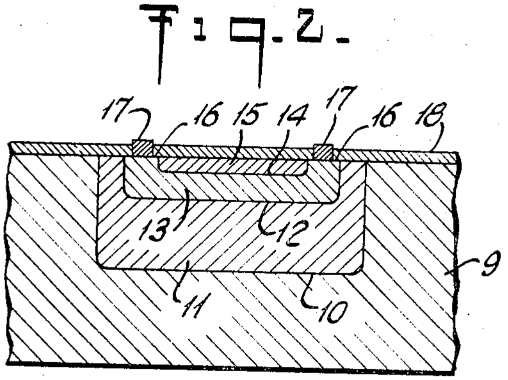
FIGS. 2 and 3 are sectional and plan views, respectively, of a semiconductor device made in accordance with the principles of this invention.
Figure 3:
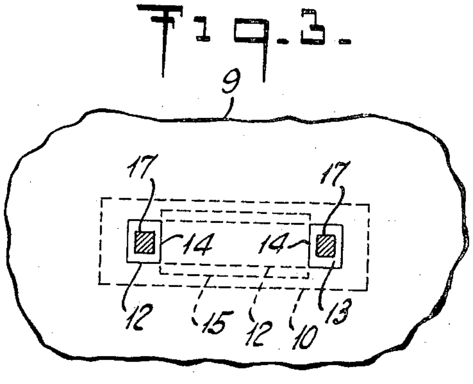

The invention overcomes this difficulty by providing a means for producing resistors of very high resistance as a part of an extremely small solid semiconductor assembly. FIGS. 2 and 3 are sectional and plan views respectively of a composite semiconductor device which embodies the principles of this invention. In these figures, the numeral 9 designates a P-type semiconductor which is provided internally with an N-type layer 11 insulated therefrom by means of a PN junction 10. Inside the N-type layer 11, which is shown cradle shaped in cross-section in FIG. 2, a strip-shaped P-type layer 13 is formed by diffusion of P-type impurities. This layer 13 is also cradle or U-shaped in cross section and is insulated from the N-type layer 11 by a PN junction 12. N-type impurities are then diffused in to form an N-type layer 15 in such a manner as to cover the entire surface of the P-type layer 13, except the ends 16 thereof, and to cover portions of the PN junction 12 that may be exposed to the surface. Thus the P-type layer 13 is insulated from the N-type layers 11 and 15 by means of the PN junctions 12 and 14, respectively, and, as a whole, a very thin strip-like layer 13 is obtained which is covered with N-type layers except the ends 16 which are exposed to the surface of the semiconductor. This surface is covered with an oxide layer 18, which is formed during diffusion.

Now assuming that the impurity concentration of the N-type layer 11 is $10^{16}$ cm.$^{-3}$, the P-type layer 13 has a surface concentration of $1\times10^{19}$ cm.$^{-3}$ with an impurity distribution of the complementary error function, and that the PN junctions 12 and 14 are located at depths $3\mu$ and $2\mu$, respectively from the surface, then the sheet resistivity of the P-type layer 13 will be approximately 4000 ohms. Then, if the concentration of the N-type layer 11 is $10^{17}$ cm.$^{-3}$ while the other conditions remain unchanged, the above value of 4000 ohms will be decreased to approximately 2000 ohms. It follows therefore that if the length-to-width ratio of the strip-like layer 13 has a value of 10, the resistance in the former case will be 4000 times 10, or 40,000 ohms, and in the latter case, 2000 times 10, or 20,000 ohms. As those knowledgeable in the art are aware, these values are far greater than can be obtained by conventional devices of comparable size. Thus, in accordance with the invention, it is possible to obtain a relatively high resistance in an extremely small area. The exposed portions 16 on both ends of the layer 13 may be connected to other circuit elements through suitable ohmic contacts 17. The parasitic capacitance is distributed along the PN junctions 12 and 14, which surround the P-type layer 13, this parasitic capacitance being proportional to the overall area of these junctions. In the embodiment described, however, the device can be made so small that the resulting capacity may be disregarded as insignificant. It is also possible to usefully employ this capacitance by selecting a suitable length-to-width ratio for the strip-shaped P-type layer 13. Moreover, where the solid circuit includes a transistor, the diffusion of the P-type layer 13 and the N-type layer 15 may be carried out simultaneously with the diffusion of the base and emitter layers of the transistor. It will also be appreciated that the P and N-type layers may be interchanged in producing a composite semiconductor device in accordance with the teachings above.

While the foregoing description sets forth the principles of the invention in connection with specific apparatus, it is to be understood that the description is made only by way of example and not as a limitation of the scope of the invention as set forth in the objects thereof and in the accompanying claim.

What is claimed is:

1. A semiconductor structure for providing a high value resistance in a semiconductor integrated circuit also including a transistor comprising: on a common substrate, two separated three-region semiconductor structure portions, a first structure portion including first, second and third regions and a second structure portion including fourth, fifth and sixth regions of which said first and fourth regions, said second and fifth regions and said third and sixth regions are respectively of material having the same semiconductivity type and impurity concentration gradient, all of said regions having a surface in a common plane, said second and fifth regions having an impurity concentration that decreases with increasing distance from said surface; said second region having contacts at the extremities thereof to define a high resistance path therethrough, said first and third regions being free of contacts and surrounding said second region at all but the extremities thereof; said fourth, fifth and sixth regions each having contacts thereon to provide the functions of a bipolar transistor.

References Cited

UNITED STATES PATENTS

| | | | |
|---|---|---|---|
| 2,954,486 | 9/1960 | Doucette et al. | 317—235 |
| 2,985,804 | 5/1961 | Buie | 317—234 |
| 3,173,101 | 3/1965 | Stelmak | 317—234 |
| 3,183,128 | 5/1965 | Leistiko et al. | 317—234 |

JOHN W. HUCKERT, *Primary Examiner.*

J. D. CRAIG, *Assistant Examiner.*